(12) United States Patent
Yasunaga et al.

(10) Patent No.: US 6,544,814 B1
(45) Date of Patent: Apr. 8, 2003

(54) METHOD OF MANUFACTURING A PACKAGED SEMICONDUCTOR DEVICE, AND A SEMICONDUCTOR DEVICE MANUFACTURED THEREBY

(75) Inventors: Masatoshi Yasunaga, Tokyo (JP); Michitaka Kimura, Tokyo (JP); Satoshi Yamada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/494,361

(22) Filed: Jan. 31, 2000

(30) Foreign Application Priority Data

Jul. 27, 1999 (JP) .......................................... 11-212758

(51) Int. Cl.[7] .......................... H01L 21/44; H01L 23/34
(52) U.S. Cl. ........................ 438/108; 438/110; 257/723
(58) Field of Search ................... 438/108, 107, 438/106, 110, 659, 156, 29; 257/786, 688, 676, 668, 659, 723

(56) References Cited

U.S. PATENT DOCUMENTS 4,970,575 A * 11/1990 Soga ........................... 357/72
6,081,038 A * 6/2000 Murayama .................. 257/783
6,168,972 B1 * 1/2001 Wang et al. ................. 438/108
6,284,554 B1 * 9/2001 Shinomiya .................... 438/15
6,335,271 B1 * 1/2002 Fukuyama ................... 438/616

FOREIGN PATENT DOCUMENTS

| JP | 9-213744 | 8/1997 |
|---|---|---|
| JP | 10-12673 | 1/1998 |
| JP | 10-135252 | 5/1998 |
| JP | 10-135254 | 5/1998 |
| JP | 10-308473 | 11/1998 |

* cited by examiner

*Primary Examiner*—Matthew Smith
*Assistant Examiner*—Calvin Lee
(74) *Attorney, Agent, or Firm*—McDermott, Will & Emery

(57) ABSTRACT

A plurality of semiconductor chips are mounted on an insulating substrate with bumps and through use of dielectric resin for mounting purposes. The semiconductor chips are sealed with transfer mold resin through a single operation while remaining on the insulating substrate. Then, the plurality of semiconductor chips are separated together with the insulating substrate and the mounting resin into individual semiconductor devices. The productivity and reliability of packaged semiconductor devices is improved.

12 Claims, 5 Drawing Sheets

METHOD OF MANUFACTURING A PACKAGED SEMICONDUCTOR DEVICE, AND A SEMICONDUCTOR DEVICE MANUFACTURED THEREBY

BACKGROUND OF THE INVENTION

1. Field of the Invention

The present invention relates to a method of manufacturing a semiconductor device, and more particularly to processes for assembling a semiconductor device.

2. Background Art

A conventional method of manufacturing a semiconductor device will be described by reference to FIGS. 5A to 5F. Conventionally, at the time of manufacture of a semiconductor device by assembly of a semiconductor chip, an insulating substrate 1 is prepared as shown in FIG. 5A. Next, as shown in FIG. 5B, semiconductor chips 3 are mounted on the insulating substrate 1 through use of a resin 2 for mounting purpose. Then, as shown in FIG. 5C, by means of connection wires 4, electrodes of the semiconductor chips 3 are electrically connected to conductive patterns provided on the insulating substrate 1. Next, as shown in FIG. 5D, all the semiconductor chips 3 provided on one side of the insulating substrate 1 are sealed by a transfer mold resin 5.

Further, as shown in FIG. 5E, electrode balls 6 for external connection purposes are formed on the other side of the insulating substrate 1 where no semiconductor chips 3 are mounted. As shown in FIG. 5F, in the final fabrication process, both the transfer mold resin 5 and the insulating substrate 1 are simultaneously diced into single semiconductor devices 7 by means of, for example, a dicing method or a laser cutting method.

According to the foregoing conventional method of manufacturing a semiconductor device, the entirety of a comparatively large insulating substrate 1 is collectively sealed by the transfer mold resin 5. To this end, the speed or pressure at which the transfer mold resin is to be injected must be increased, which results in deformation of the connection wires 4, electrical short circuits across the connection wires, or occurrence of fatal imperfections, such as open circuits, which would be caused by removal or breakage of the connection wires 4.

Since the connection wires 4 are used for establishing electrical connection, a region where the wires 4 are fixed must be ensured, which renders further miniaturization of a semiconductor device difficult.

SUMMARY OF THE INVENTION

The present invention has been conceived to solve the foregoing problem in the conventional art, and the object of the present invention is to improve the productivity and reliability of a semiconductor device by means of a method in which semiconductor chips are bonded and sealed by means of flip-chip bonding and a single sealing operation.

According to one aspect of the present invention, in a method of manufacturing a semiconductor device, a plurality of semiconductor chips are mounted on an insulating substrate through use of bumps and with a dielectric resin. The plurality of semiconductor chips mounted on the insulating substrate are sealed through use of a transfer mold resin. Further, the plurality of semiconductor chips, which are sealed on the insulating substrate with a resin, are separated into individual semiconductor devices.

In another aspect, in the method, the plurality of semiconductor chips may be mounted on the insulating substrate through use of a plurality of pieces of separated dielectric resin.

In another aspect, in the method, the plurality of semiconductor chips may be mounted on the insulating substrate through use of a plate-like single piece of dielectric resin.

Still in another aspect, in the method, the plurality of semiconductor chips are mounted on the insulating substrate in the form of a semiconductor chip group including a predetermined number of non-separated semiconductor chips.

Further in another aspect, in the method, the plurality of semiconductor chips may be mounted on the insulating substrate while remaining connected in the form of a wafer.

Other and further objects, features and advantages of the invention will appear more fully from the following description.

BRIEF DESCRIPTION OF THE PREFERRED EMBODIMENTS

DETAILED DESCRIPTION OF THE PREFERRED EMBODIMENTS

Figure 1A:
FIGS. 1A to 1E show a method of manufacturing a packaged-type semiconductor device according to a first embodiment of the present invention.

Preferred embodiments of the present invention will now be described. Throughout the drawings, like reference numerals designate like or corresponding elements, and repetitions of their explanations are simplified or omitted.

First Embodiment

A first embodiment of the present invention will now be described by reference to FIGS. 1A to 1E.

As shown in FIG. 1A, an insulating substrate 10 is prepared.

Figure 1B:
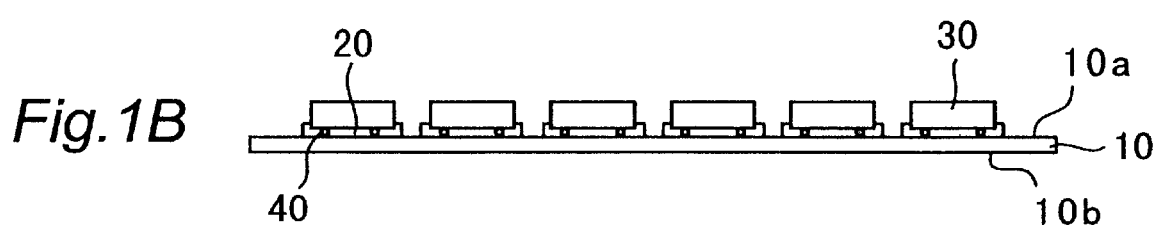

Next, as shown in FIG. 1B, semiconductor chips 30 are mounted on the surface of the insulating substrate 10, through use of a dielectric resin 20 for mounting purposes. Simultaneously, electrodes of the semiconductor chips 30 are electrically connected to conductive patterns provided on the insulating substrate, by way of connection bumps 40 formed of; e.g., solder or gold.

Figure 1C:
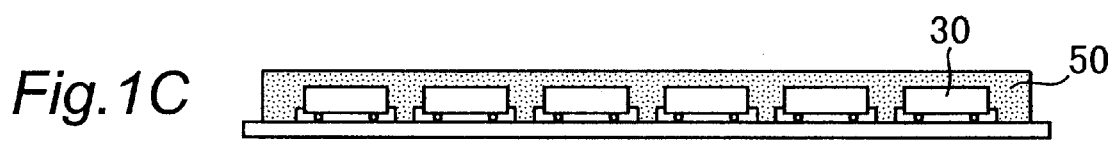

As shown in FIG. 1C, one side 10a of the insulating substrate 10 where the semiconductor chips 30 are mounted thereon is wholly sealed by means of a transfer mold resin 50 through a single operation.

Figure 1D:
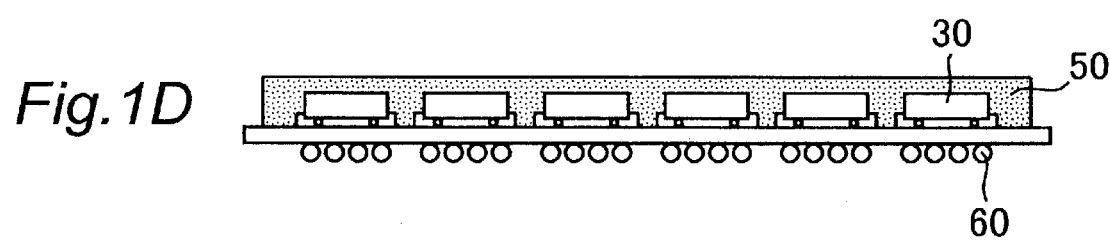

As shown in FIG. 1D, electrode balls 60 for external connection purposes are formed on the other side 10b of the insulating substrate 10 on which the semiconductor chips 30 are not mounted.

Figure 1E:
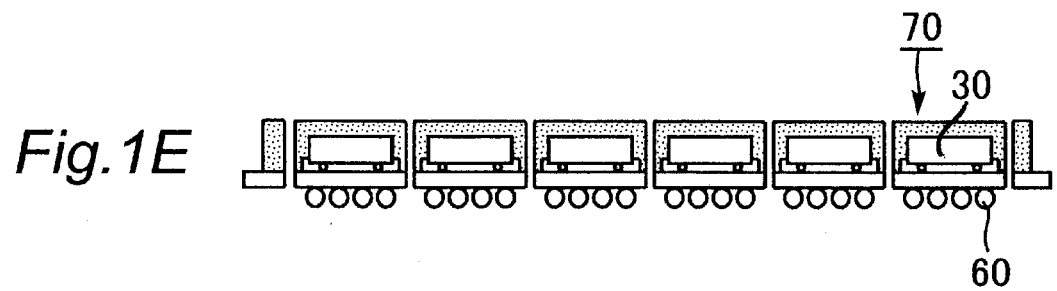

Next, as shown in FIG. 1E, in the final fabrication process, the transfer mold resin 50 and the insulating substrate 10 are simultaneously diced into individual semiconductor devices 70 by means of, for example, a dicing method or a laser cutting method.

An advantageous result analogous to that yielded when the dielectric resin 20 is used may also be yielded even when insulating resin containing conductive fine particles; i.e., anisotropic conductive resin, is used in place of the resin 20.

In the present embodiment, the connection bumps 40 are used in place of connection wires in order to electrically connect the electrodes of the semiconductor chips 30 to the conductive patterns provided on the insulating substrate. Therefore, the present invention can prevent occurrence of fatal defects, such as deformation of connection wires, electrical short-circuits, or open circuits, which would otherwise be caused when the semiconductor chips 30 are sealed by means of the transfer mold resin 50.

Since the connection bumps 40 are provided immediately below the semiconductor chips 30, a special region for connection wires where semiconductor chips are not present is not required. Accordingly, the single semiconductor devices 70 can be made compact, and the number of semiconductor devices 70 to be fabricated on a single substrate 10 can be increased.

Second Embodiment

A second embodiment of the present invention will now be described with reference to FIGS. 2A to 2E.

Figure 2A:
FIGS. 2A to 2E show a method of manufacturing a packaged-type semiconductor device according to a second embodiment of the present invention.

As shown in FIG. 2A, the insulating substrate 10 is prepared.

Figure 2B:
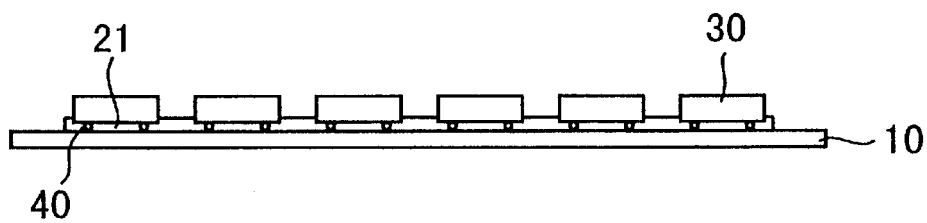

As shown in FIG. 2B, the semiconductor chips 30 are mounted on the insulating substrate 10 through use of a dielectric resin 21 for mounting purposes. In contrast with the case shown in FIG. 1B where the dielectric resin 20 is provided at positions so as to correspond to the respective semiconductor chips 30, a single piece of dielectric resin 21 is provided on the insulating substrate 10, and the plurality of semiconductor chips 30 are mounted on the dielectric resin 21. The dielectric resin 21 is a thin, flat single piece.

Figure 2C:
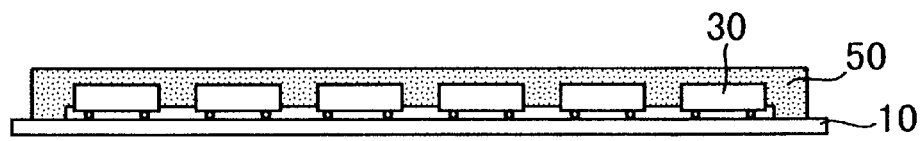
Figure 2D:
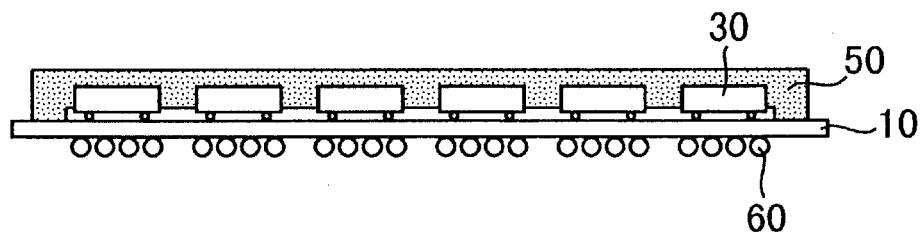

As in the case of the first embodiment, the insulating substrate is subjected to a sealing process shown in FIG. 2C and a ball formation process shown in FIG. 2D.

Figure 2E:
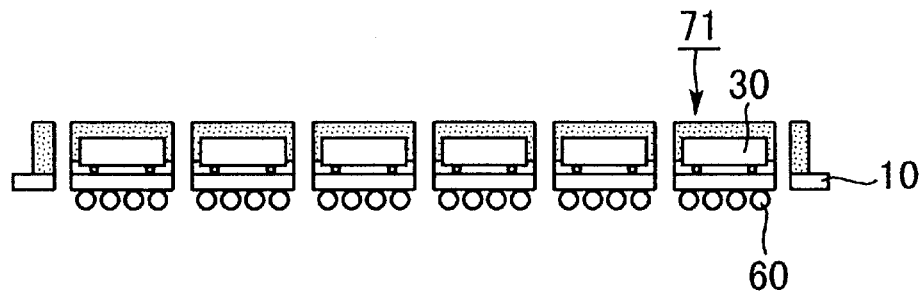

Then, as shown in FIG. 2E, in the final process, the transfer mold resin 50, the resin 21, and the insulating substrate 10 are simultaneously sliced into individual semiconductor devices 71.

According to the second embodiment, semiconductor device 71 can be manufactured by means of flip-chip bonding and a single sealing operation, thus preventing deformation of wires, which would otherwise be caused by molding. Thus, the size of a resultant package can be diminished, thereby yielding an advantage of increasing the yield of packages.

Third Embodiment

A third embodiment of the present invention will now be described by reference to FIGS. 3A to 3E.

Figure 3A:
FIGS. 3A to 3E show a method of manufacturing a packaged-type semiconductor device according to a third embodiment of the present invention.

As shown in FIG. 3A, the insulating substrate 10 is prepared.

Figure 3B:
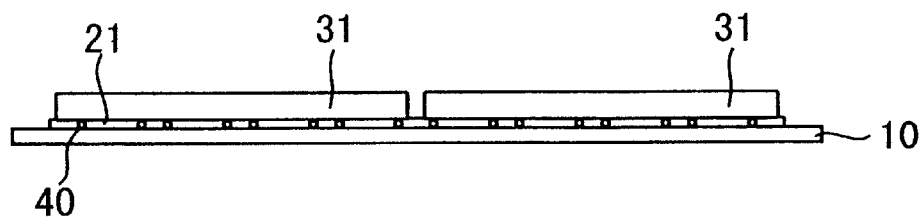

Next, as shown in FIG. 3B, a group of semiconductor chips 31, which are connected into a single unit, is mounted on the single insulating substrate 10 through use of the single piece of insulating resin 21. The semiconductor chip group 31 includes individual semiconductor chips, which are separated in the form of a large block from a wafer.

Figure 3C:
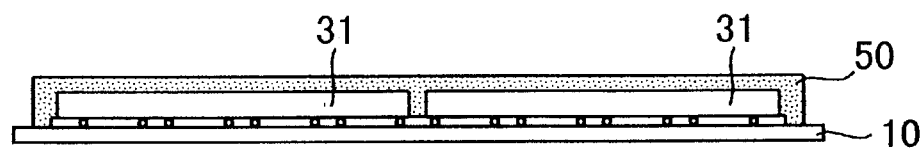
Figure 3D:
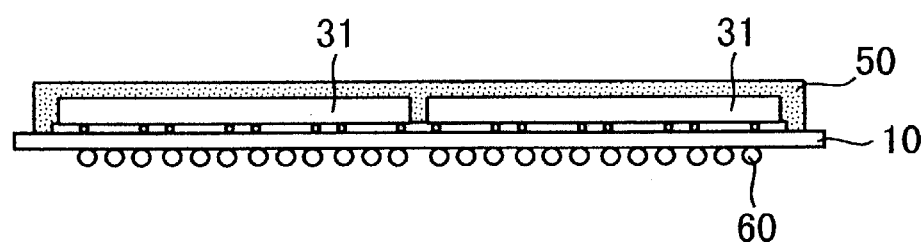

Subsequently, the insulating substrate 10 is subjected to a sealing process shown in FIG. 3C and a ball formation process shown in FIG. 3D.

Figure 3E:
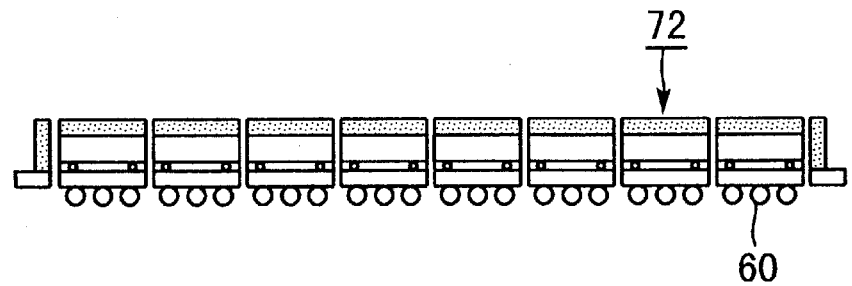

Then, as shown in FIG. 3E, in the final process, transfer mold resin 50, the group of semiconductor chips 31 connected into a single unit, the dielectric resin 21, and the insulating substrate 10, are simultaneously sliced into individual semiconductor devices 72.

According to the third embodiment, semiconductor devices can be manufactured through flip-chip bonding and a single sealing operation, thus preventing deformation of wires, which would otherwise be caused by molding. The present invention yields the advantage of making semiconductor packages small and increasing the yield of semiconductor packages.

A group of semiconductor chips, which comprises a predetermined number of semiconductor chips that remain connected together, is mounted on the insulating substrate 10, thus resulting in an increase in the productivity of semiconductor devices.

Fourth Embodiment

A fourth embodiment of the present invention will now be described by reference to FIGS. 4A to 4E.

Figure 4A:
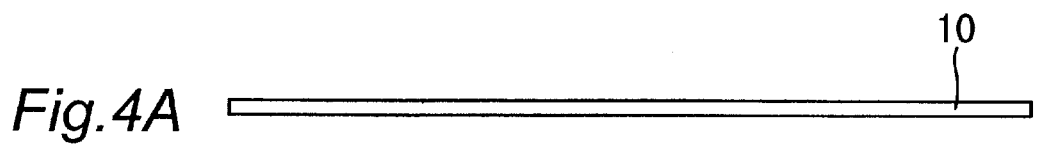
FIGS. 4A to 4E show a method of manufacturing a packaged-type semiconductor device according to a forth embodiment of the present invention.

As shown in FIG. 4A, the insulating substrate 10 is prepared.

Figure 4B:
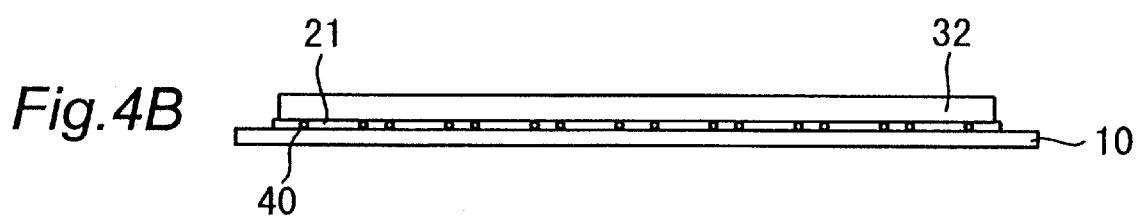

Next, as shown in FIG. 4B, a single semiconductor wafer 32, which is not sliced into single semiconductor chips, is mounted on the insulating substrate 10 through use of the single piece of insulating resin 21.

Figure 4C:
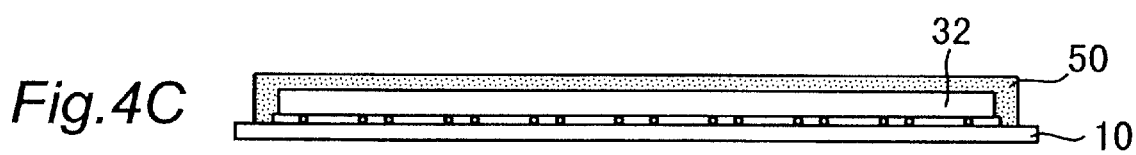
Figure 4D:
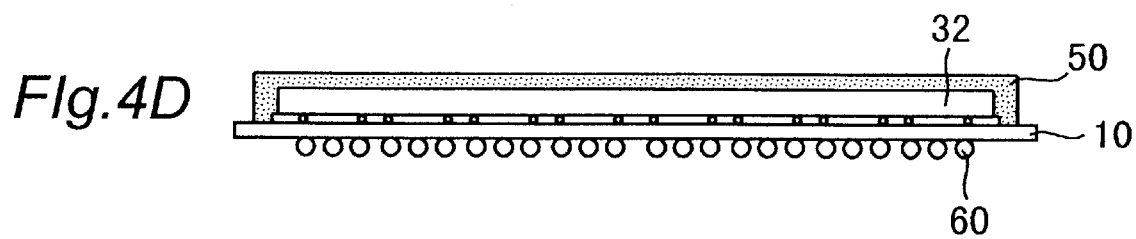

Subsequently, the insulating substrate 10 is subjected to a sealing process shown in FIG. 4C and a ball formation process shown in FIG. 4D.

Figure 4E:
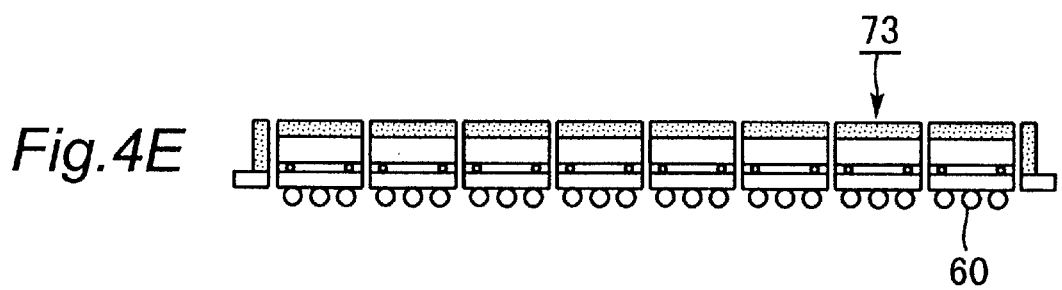
Figure 5A:
FIGS. 5A to 5F show a conventional method of manufacturing a packaged-type semiconductor device.
Figure 5B:
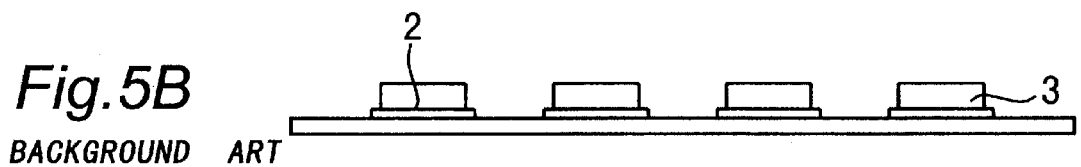
Figure 5C:
Figure 5D:
Figure 5E:
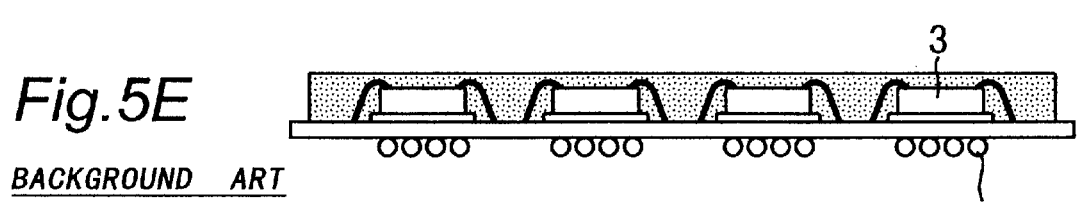
Figure 5F:
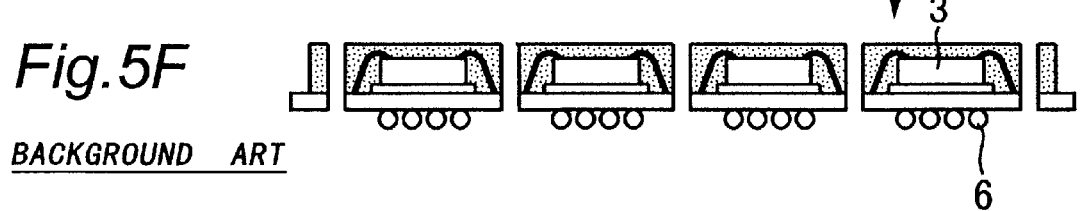

Then, as shown in FIG. 4E, in the final process, transfer mold resin 50, the semiconductor wafer 32, the dielectric resin 21, and the insulating substrate 10, are simultaneously sliced into individual semiconductor devices 73.

According to the fourth embodiment, the semiconductor device 73 can be made compact so as to become completely identical in size with a semiconductor chip. Further, there is yielded an advantage of increasing the yield of the semiconductor devices 73.

According to the fourth embodiment, semiconductor devices can be manufactured through flip-chip bonding and a single sealing operation, thus preventing deformation of wires, which would otherwise be caused by molding. The present invention yields the advantage of making semiconductor packages small and increasing the yield of semiconductor packages.

Further, since the semiconductor wafer is mounted on the insulating substrate 10 before the semiconductor wafer is separated into single chips, the productivity of semiconductor chips can be improved.

According to the present invention, semiconductor chips are bonded to the insulating substrate through use of bumps by means of flip-chip bonding and are sealed by a single sealing operation. The semiconductor chips are separated into individual semiconductor devices, thus rendering the single semiconductor devices compact and increasing the yield of semiconductor devices. Productivity of semiconductor devices is also improved.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-212758, filed on Jul. 27, 1999 including specification, claims, drawings and summary, on which the Convention priority of the present application is based, are incorporated herein by reference in its entirety.

What is claimed is:

1. A method of manufacturing a semiconductor device, comprising the steps of:

mounting a plurality of semiconductor chips on an insulating substrate through use of bumps and with a dielectric resin;

sealing said plurality of semiconductor chips mounted on said insulating substrate through use of a transfer mold resin; and separating said plurality of semiconductor chips, which are sealed on said insulating substrate with a resin, into individual semiconductor devices.

2. The method of manufacturing a semiconductor device according to according to claim 1, wherein said plurality of semiconductor chips are mounted on said insulating substrate through use of a plurality of pieces of separated dielectric resin.

3. The method of manufacturing a semiconductor device according to claim 1, wherein said plurality of semiconductor chips are mounted on said insulating substrate through use of a plate-like single piece of dielectric resin.

4. The method of manufacturing a semiconductor device according to claim 1, wherein said plurality of semiconductor chips are mounted on said insulating substrate in the form of a semiconductor chip group including a predetermined number of non-separated semiconductor chips.

5. The method of manufacturing a semiconductor device according to claim 1, wherein said plurality of semiconductor chips are mounted on said insulating substrate while remaining connected in the form of a wafer.

6. The method of manufacturing a semiconductor device according claim 1, wherein said bumps are formed from solder.

7. The method of manufacturing a semiconductor device according to claim 1, wherein said bumps are formed from gold.

8. The method of manufacturing a semiconductor device according to claim 1, wherein said bumps are formed from solder, and said resin includes conductive fine particles.

9. A semiconductor device manufactured in accordance with the method according to claim 1.

10. The method of claim 1, wherein said step of separating said plurality of semiconductor chips includes dicing said insulating substrate.

11. The method of claim 1, wherein the top surface of each of said plurality of semiconductor chips becomes covered with said transfer mold resin.

12. The method of claim 1, wherein said plurality of semiconductor chips mounted on said insulating substrate are wholly sealed through use of a transfer mold resin through a single operation.

* * * * *